US009444425B2

(12) United States Patent
Mow et al.

(10) Patent No.: US 9,444,425 B2
(45) Date of Patent: Sep. 13, 2016

(54) ELECTRONIC DEVICE WITH ADJUSTABLE WIRELESS CIRCUITRY

(71) Applicant: Apple Inc., Cupertino, CA (US)

(72) Inventors: Matthew A. Mow, Los Altos, CA (US);
Thomas E. Biedka, San Jose, CA (US);
Liang Han, Sunnyvale, CA (US);
Ming-Ju Tsai, Cupertino, CA (US);
James G. Judkins, Campbell, CA (US); Enrique Ayala Vazquez, Watsonville, CA (US); Jayesh Nath, Milpitas, CA (US); Hongfei Hu, Santa Clara, CA (US); Nanbo Jin, Sunnyvale, CA (US); Hao Xu, Cupertino, CA (US);
Yijun Zhou, Sunnyvale, CA (US);
Yuehui Ouyang, Sunnyvale, CA (US);
Victor Lee, Sunnyvale, CA (US);
Mattia Pascolini, San Francisco, CA (US); Ruben Caballero, San Jose, CA (US)

(73) Assignee: Apple Inc., Cupertino, CA (US)

(*) Notice: Subject to any disclaimer, the term of this patent is extended or adjusted under 35 U.S.C. 154(b) by 8 days.

(21) Appl. No.: 14/310,240

(22) Filed: Jun. 20, 2014

(65) Prior Publication Data
US 2015/0372656 A1    Dec. 24, 2015

(51) Int. Cl.
*H04B 1/04* (2006.01)
*H03H 7/38* (2006.01)
(Continued)

(52) U.S. Cl.
CPC .............. *H03H 7/38* (2013.01); *H04B 1/0458* (2013.01); *H04B 1/18* (2013.01); *H04B 1/48* (2013.01); *H04B 17/29* (2015.01)

(58) Field of Classification Search
CPC . H03H 7/38; H03H 2007/386; H04B 1/1458
USPC .................. 455/120–121; 343/852, 860–861
See application file for complete search history.

(56) References Cited

U.S. PATENT DOCUMENTS

| 5,337,353 A | 8/1994 | Boie et al. |
| 5,451,965 A | 9/1995 | Matsumoto |

(Continued)

FOREIGN PATENT DOCUMENTS

| CN | 1343380 | 4/2002 |
| CN | 1747228 | 6/2006 |

(Continued)

OTHER PUBLICATIONS

Myllmaki et al., "Capacitive recognition of the user's hand grip position in mobile handsets", Progress in Electromagnetics Research B, vol. 22, 2010, pp. 203-220.

(Continued)

*Primary Examiner* — Lee Nguyen
(74) *Attorney, Agent, or Firm* — Treyz Law Group, P.C.; G. Victor Treyz; Michael H. Lyons

(57) ABSTRACT

An electronic device may be provided with wireless circuitry. Control circuitry may be used to adjust the wireless circuitry. The wireless circuitry may include antennas that are tuned, adjustable impedance matching circuitry, antenna port selection circuitry, and adjustable transceiver circuitry. Wireless circuit adjustments may be made by ascertaining a current usage scenario for the electronic device based on sensor data, information from cellular base station equipment or other external equipment, signal-to-noise ratio information or other signal information, antenna impedance measurements, and other information about the operation of the electronic device.

15 Claims, 9 Drawing Sheets

(51) Int. Cl.
  *H04B 1/48* (2006.01)
  *H04B 17/29* (2015.01)
  *H04B 1/18* (2006.01)
  *H01Q 11/12* (2006.01)

(56) References Cited

U.S. PATENT DOCUMENTS

| | | |
|---|---|---|
| 5,463,406 A | 10/1995 | Vannatta et al. |
| 5,650,597 A | 7/1997 | Redmayne |
| 5,748,054 A | 5/1998 | Tonegawa et al. |
| 5,777,693 A | 7/1998 | Kishigami et al. |
| 5,805,067 A | 9/1998 | Bradley et al. |
| 5,826,458 A | 10/1998 | Little |
| 5,854,972 A | 12/1998 | Pennock et al. |
| 5,864,316 A | 1/1999 | Bradley et al. |
| 5,905,467 A | 5/1999 | Narayanaswamy et al. |
| 5,956,626 A | 9/1999 | Kaschke et al. |
| 6,242,982 B1 | 6/2001 | Ibelings et al. |
| 6,275,684 B1 | 8/2001 | Kaneko et al. |
| 6,285,893 B1 | 9/2001 | Keirinbou |
| 6,329,958 B1 | 12/2001 | McLean et al. |
| 6,380,899 B1 | 4/2002 | Madsen et al. |
| 6,408,187 B1 | 6/2002 | Merriam |
| 6,408,193 B1 | 6/2002 | Katagishi et al. |
| 6,456,856 B1 | 9/2002 | Werling et al. |
| 6,483,463 B2 | 11/2002 | Kadambi et al. |
| 6,529,088 B2 | 3/2003 | Lafleur et al. |
| 6,590,539 B2 | 7/2003 | Shinichi |
| 6,611,227 B1 | 8/2003 | Nebiyeloul-Kifle et al. |
| 6,657,595 B1 | 12/2003 | Phillips et al. |
| 6,678,532 B1 | 1/2004 | Mizoguchi |
| 6,757,267 B1 | 6/2004 | Evans et al. |
| 6,761,316 B2 | 7/2004 | Bridgelall et al. |
| 6,806,835 B2 | 10/2004 | Iwai et al. |
| 6,862,433 B2 | 3/2005 | Callaway |
| 6,879,293 B2 | 4/2005 | Sato |
| 6,959,209 B2 | 10/2005 | Fang |
| 6,978,121 B1 | 12/2005 | Lane et al. |
| 6,985,113 B2 | 1/2006 | Nishimura et al. |
| 7,016,686 B2 | 3/2006 | Spaling |
| 7,039,435 B2 | 5/2006 | McDowell et al. |
| 7,050,010 B2 | 5/2006 | Wang et al. |
| 7,053,629 B2 | 5/2006 | Neverman |
| 7,109,945 B2 | 9/2006 | Mori |
| 7,113,087 B1 | 9/2006 | Casebolt |
| 7,116,959 B2 | 10/2006 | Link et al. |
| 7,146,139 B2 | 12/2006 | Nevermann |
| 7,149,483 B1 | 12/2006 | Reinisch et al. |
| 7,181,251 B2 | 2/2007 | Stohr et al. |
| 7,187,332 B2 | 3/2007 | Kezys et al. |
| 7,499,722 B2 | 3/2009 | McDowell et al. |
| 7,522,846 B1 | 4/2009 | Lewis et al. |
| 7,557,760 B2 | 7/2009 | Chang et al. |
| 7,633,076 B2 | 12/2009 | Huppi et al. |
| 7,826,875 B2 | 11/2010 | Karaoguz |
| 7,834,813 B2 | 11/2010 | Caimi et al. |
| 7,916,089 B2 | 3/2011 | Schlub et al. |
| 7,999,748 B2 | 8/2011 | Ligtenberg et al. |
| 8,023,984 B2 | 9/2011 | Jin et al. |
| 8,068,798 B2 | 11/2011 | Wilcox et al. |
| 8,131,232 B2 | 3/2012 | Muhammad |
| 8,159,399 B2 | 4/2012 | Dorsey |
| 8,255,009 B2 | 8/2012 | Sorensen et al. |
| 8,326,221 B2 | 12/2012 | Dorsey |
| 8,326,385 B2 | 12/2012 | Brogle et al. |
| 8,417,296 B2 | 4/2013 | Caballero et al. |
| 8,432,322 B2 | 4/2013 | Amm et al. |
| 8,466,839 B2 | 6/2013 | Schlub et al. |
| 8,749,523 B2 | 6/2014 | Pance et al. |
| 8,781,420 B2 | 7/2014 | Schlub et al. |
| 9,071,336 B2 | 6/2015 | Schlub et al. |
| 9,179,299 B2 | 11/2015 | Schlub et al. |
| 2002/0027474 A1 | 3/2002 | Bonds |
| 2002/0060645 A1 | 5/2002 | Shinichi |
| 2002/0094789 A1 | 7/2002 | Harano |
| 2002/0123309 A1 | 9/2002 | Collier et al. |
| 2003/0062907 A1 | 4/2003 | Nevermann |
| 2003/0064732 A1 | 4/2003 | McDowell et al. |
| 2003/0186728 A1 | 10/2003 | Manjo |
| 2003/0197597 A1 | 10/2003 | Bahl et al. |
| 2003/0210203 A1 | 11/2003 | Phillips et al. |
| 2003/0218993 A1 | 11/2003 | Moon et al. |
| 2004/0176083 A1 | 9/2004 | Shiao et al. |
| 2004/0189542 A1 | 9/2004 | Mori |
| 2004/0222926 A1 | 11/2004 | Kontogeorgakis et al. |
| 2005/0124305 A1 | 6/2005 | Stichelbout |
| 2005/0245204 A1 | 11/2005 | Vance |
| 2006/0050007 A1 | 3/2006 | Min |
| 2006/0161871 A1 | 7/2006 | Hotelling et al. |
| 2006/0205368 A1 | 9/2006 | Bustamante et al. |
| 2006/0232468 A1 | 10/2006 | Parker et al. |
| 2006/0244663 A1 | 11/2006 | Fleck et al. |
| 2007/0188375 A1 | 8/2007 | Richards et al. |
| 2008/0106476 A1 | 5/2008 | Tran et al. |
| 2008/0165063 A1 | 7/2008 | Schlub et al. |
| 2008/0248837 A1 | 10/2008 | Kunkel |
| 2008/0309836 A1 | 12/2008 | Sakama et al. |
| 2008/0316120 A1 | 12/2008 | Hirota et al. |
| 2009/0000023 A1 | 1/2009 | Wegelin et al. |
| 2009/0096683 A1 | 4/2009 | Rosenblatt et al. |
| 2009/0174611 A1 | 7/2009 | Schlub et al. |
| 2009/0251384 A1 | 10/2009 | Ligtenberg |
| 2009/0270137 A1 | 10/2009 | Sorensen et al. |
| 2009/0295648 A1 | 12/2009 | Dorsey et al. |
| 2009/0305742 A1 | 12/2009 | Caballero |
| 2010/0167672 A1 | 7/2010 | Ahn et al. |
| 2010/0203833 A1 | 8/2010 | Dorsey |
| 2011/0012793 A1 | 1/2011 | Amm et al. |
| 2011/0012794 A1 | 1/2011 | Schlub et al. |
| 2011/0043227 A1 | 2/2011 | Pance et al. |
| 2011/0212746 A1 | 9/2011 | Sarkar et al. |
| 2011/0250928 A1 | 10/2011 | Schlub et al. |
| 2012/0071195 A1 | 3/2012 | Chakraborty et al. |
| 2012/0202560 A1 | 8/2012 | Donaldson |
| 2012/0214422 A1 | 8/2012 | Shi et al. |
| 2013/0035051 A1 | 2/2013 | Mujtaba et al. |
| 2014/0003365 A1 | 1/2014 | Carey et al. |
| 2014/0139380 A1 | 5/2014 | Ouyang et al. |

FOREIGN PATENT DOCUMENTS

| | | |
|---|---|---|
| CN | 101330162 | 12/2008 |
| DE | 102005035935 | 2/2007 |
| EP | 0 564 164 | 10/1993 |
| EP | 1298809 | 4/2003 |
| EP | 1 469 550 | 10/2004 |
| EP | 1 524 774 | 4/2005 |
| EP | 1564896 | 8/2005 |
| EP | 2528165 | 11/2012 |
| EP | 2722996 | 4/2014 |
| GB | 2 380 359 | 4/2003 |
| JP | 2003179670 | 6/2003 |
| JP | 2003209483 | 7/2003 |
| JP | 2003216318 | 7/2003 |
| JP | 200667061 | 3/2006 |
| JP | 2006218083 | 8/2006 |
| JP | 2008009759 | 1/2008 |
| JP | 2008537615 | 9/2008 |
| JP | 2009032570 | 2/2009 |
| WO | 0131733 | 5/2001 |
| WO | 02/05443 | 1/2002 |
| WO | 2005112280 | 11/2005 |
| WO | 2007116790 | 10/2007 |
| WO | 2008/078142 | 7/2008 |
| WO | 2009022387 | 2/2009 |
| WO | 2009149023 | 12/2009 |
| WO | 2012066559 | 5/2012 |

OTHER PUBLICATIONS

Breeden, "Audible Message Alert With Ear Proximity Detector for Portable Handsets," Motorola, Inc. Technical Developments, vol. 12, Apr. (p. 102-103).

(56) References Cited

OTHER PUBLICATIONS

"CapTouch Programmable Controller for Single-Electrode Capacitance Sensors", AD7147 Data Sheet Rev. B, [online], Analog Devices, Inc., [retrieved on Dec. 7, 2009], <URL: http://www.analog.com/static/imported-files/data_sheets/AD7147.pdf>.
Ayala Vasquez et al. U.S. Appl. No. 14/283,039, filed May 20, 2014.
Jadhav et al. U.S. Appl. No. 14/201,620, filed Mar. 7, 2014.
Schlub et al. U.S. Appl. No. 13/865,578, filed Apr. 18, 2013.

US 9,444,425 B2

ELECTRONIC DEVICE WITH ADJUSTABLE WIRELESS CIRCUITRY

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It can be challenging to ensure that wireless communications circuitry in an electronic device will perform satisfactorily in all operating conditions. For example, the operating environment of an electronic device such as the presence or absence of an external object in the vicinity of an electronic device may affect antenna tuning and wireless performance. Unless care is taken, the wireless performance of an electronic device may not be satisfactory in certain operating environments.

It would therefore be desirable to be able to provide improved wireless circuitry for operating electronic devices in various operating environments.

SUMMARY

An electronic device may be provided with wireless circuitry. Control circuitry may be used to adjust the wireless circuitry to optimize wireless performance in real time. The wireless circuitry may include antennas that are tuned to optimize performance, adjustable matching circuitry that is adjusted to optimize performance, antenna port selection circuitry that is adjusted to optimize performance, and transceivers and other wireless circuits that can be adjusted to optimize performance.

Wireless circuit adjustments may be made based on knowledge of how an electronic device is being used (i.e., a current usage scenario). Adjustments may be made based on sensor data such as data form an orientation sensor, a proximity sensor, a gyroscope, an audio sensor, a connector sensor, or other sensor. Adjustments may also be made based on locally generated signal information such as signal-to-noise ratio information and received signal strength information from a baseband processor or other circuit in the electronic device. Adjustments may also be made based on measured antenna impedance. An electronic device may wirelessly receive information such as link quality information, signal-to-noise ratio information, or other information from external equipment such as a cellular telephone network base station. This remotely generated information may also be used in determining which wireless circuit adjustments should be made to optimize performance.

DETAILED DESCRIPTION

Figure 1:
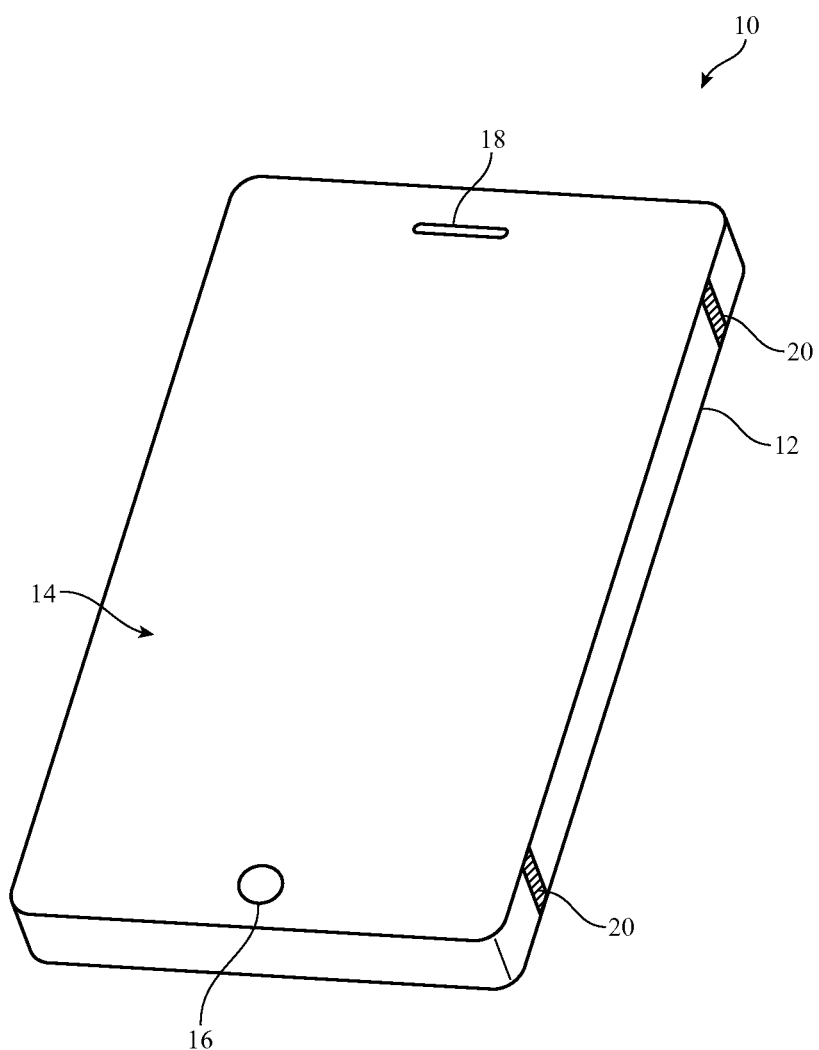
FIG. 1 is a perspective view of an illustrative electronic device with wireless communications circuitry in accordance with an embodiment.

An electronic device such as electronic device 10 of FIG. 1 may contain wireless circuitry. A coupler may be used to tap into a path between a radio-frequency transceiver and an associated antenna. The output from the tap can be used to measure antenna signals being transmitted to the antenna and antenna signals being reflected from the antenna. Processing circuitry within the electronic device may process the tapped antenna signals to produce antenna impedance information.

Sensors may also gather information on the operating environment of the electronic device. For example, sensors may be used to determine whether an object is present in the vicinity of an antenna and may be used to determine whether a connector has been plugged into a connector port in the electronic device. Sensor data may also be used to monitor the orientation of the electronic device relative to the Earth and other environmental parameters.

The electronic device may gather information on received signals such as received signal strength information, signal-to-noise information, and other received signal information using a baseband processor or other control circuitry in the electronic device. The electronic device may also communicate with a cellular telephone base station or other external equipment. The external equipment may gather information on received signals at the external equipment. This information may, in turn, be wirelessly conveyed hack to the electronic device.

The information that is conveyed to the electronic device from the external equipment, the antenna impedance information, information from the sensors, locally gathered information on received signals such as received signal strength information, and the operating status of the device and its components can be used in tuning antennas, adjusting matching circuitry, switching antennas into and out of use (i.e., making antenna port selections), and otherwise making adjustments to the wireless circuitry in device 10 to ensure that the wireless circuitry of device 10 operates optimally.

Device 10 may contain wireless communications circuitry that operates in long-range communications bands such as cellular telephone hands and wireless circuitry that operates in short-range communications bands such as the 2.4 GHz Bluetooth® band and the 2.4 and 5 GHz WiFi® wireless local area network bands (sometimes referred to as IEEE 802.11 bands or wireless local area network communications bands). Device 10 may also contain wireless communications circuitry for implementing near-field communications, light-based wireless communications, satellite navigation system communications, or other wireless communications.

Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using as unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed horn an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18. Openings may be formed in housing 12 to form communications ports (e.g., an audio jack port, a digital data port, etc.). The periphery of housing 12 may be formed using a metal portion of a rear housing structure (e.g., sidewalls that extend upwards along some or all of the edges of device 10) or may be formed from one or more separate peripheral conductive housing members (e.g., bezel members or a metal band that serves as vertical or curved sidewalls). Gaps may be formed in the peripheral conductive housing structures of housing 12 such as gaps 20. Gaps 20 may, for example, isolate end portions of a peripheral conductive member from a central ground plane in device 10. Gaps 20 may be filled with plastic, air, and/or other dielectric material.

Figure 2:
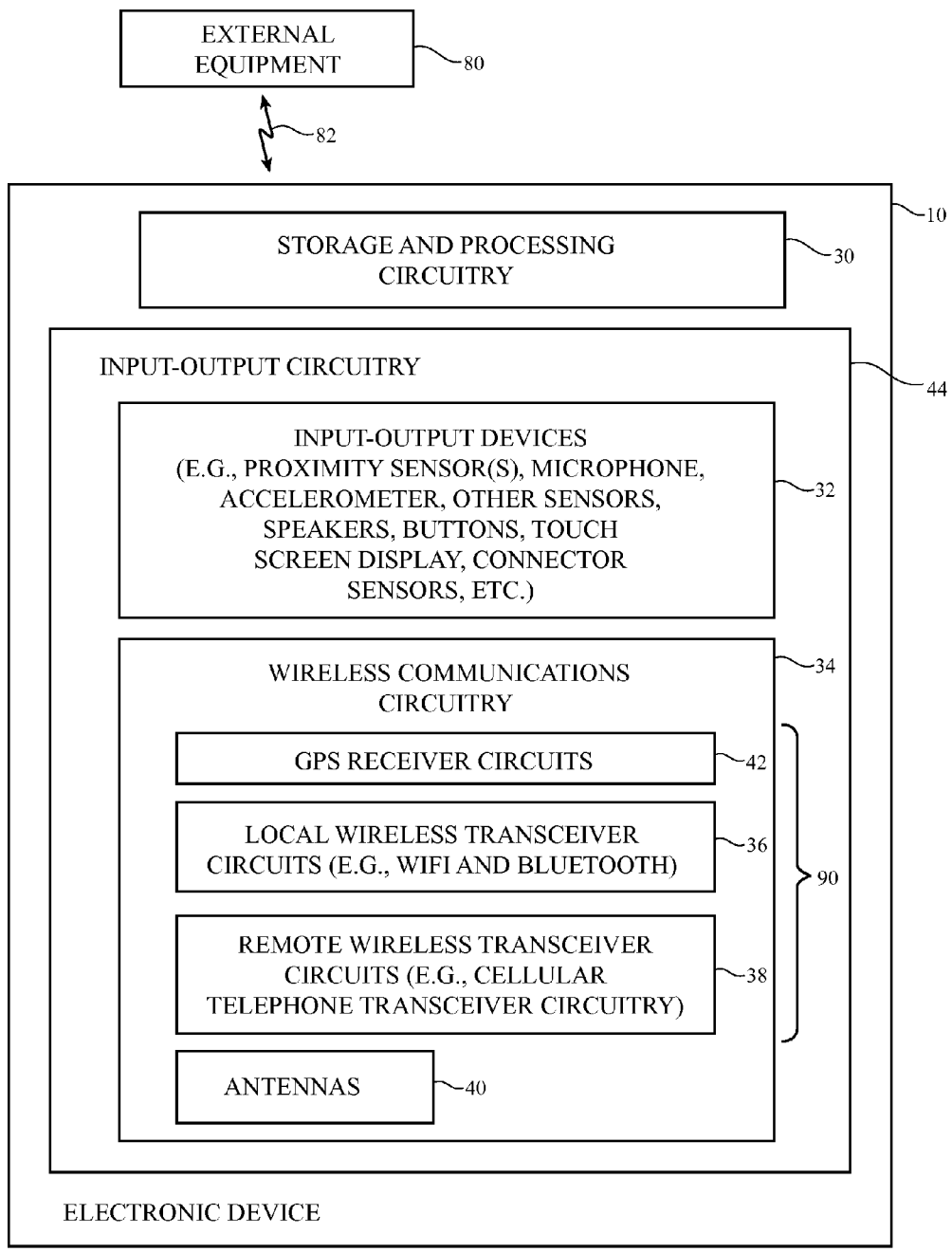
FIG. 2 is a schematic diagram of an illustrative electronic device with wireless communication circuitry in accordance with an embodiment.

A schematic diagram showing illustrative components that may be used in device 10 is shown in FIG. 2. As shown in FIG. 2, device 10 may include control circuitry such as storage and processing circuitry 30. Storage and processing circuitry 30 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 30 may be used to control the operation of device 10. This processing circuitry may be based on one or more microprocessors, microcontrollers, digital signal processors, baseband processor integrated circuits, application specific integrated circuits, etc.

Storage and processing circuitry 30 may be used to run software on device 10, such as internet browsing applications, voice-over-internet-protocol VOIP) telephone call applications, email applications, media playback applications, operating system functions, etc. To support interactions with external equipment, storage and processing circuitry 30 may be used in implementing communications protocols. Communications protocols that may be implemented using storage and processing circuitry 30 include internet protocols, wireless local area network protocols (e.g., IEEE 802.11 protocols—sometimes referred to as WiFi®), protocols for other short-range wireless communications links such as the Bluetooth® protocol, cellular telephone protocols. MIMO protocols, antenna diversity protocols, etc.

Device 10 may include input-output circuitry 44. Input-output circuitry 44 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors (e.g., a capacitive proximity sensor and/or an infrared proximity sensor), magnetic sensors, connector port sensors that determine whether a connector such as an audio jack and/or digital data connector have been inserted in a connector port in device 10, a connector port sensor or other sensor that determines whether device 10 is mounted in a dock, a connector interface circuit or other circuitry that monitors for the presence of connectors and identifies which type of connector has been plugged in, a sensor that measures a resistor or other circuit in a connector plug that serves as an accessory identifier, other sensors for determining whether device 10 is coupled to an accessory and/or for determining what type of connector and/or other accessory is coupled to device 10, and other sensors and input-output components.

Input-output circuitry 44 may include wireless communications circuitry 34 for communicating wirelessly with external equipment. Wireless communications circuitry 34 may include radio-frequency (RE) transceiver circuitry formed from one or more integrated circuits, power amplifier circuitry, low-noise input amplifiers, passive RI components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42.

Transceiver circuitry 36 may be wireless local area network transceiver circuitry that may handle 2.4 GHz and 5 GHz bands for WiFi® (IEEE 802.11) communications and that may handle the 2.4 GHz Bluetooth® communications band.

Circuitry 34 may use cellular telephone transceiver circuitry 38 for handling wireless communications in frequency ranges such as a low communications band from 700 to 960 MHz, a midband from 1710 to 2170 MHz, and a high band horn 2300 to 2700 MHz or other communications bands between 700 MHz and 2700 MHz or other suitable frequencies (as examples). Circuitry 38 may handle voice data and non-voice data.

Wireless communications circuitry 34 can include circuitry for other short-range and long-range wireless links if desired. For example, wireless communications circuitry 34 (e.g., transceivers 90) may include 60 GHz transceiver circuitry, circuitry for receiving television and radio signals, paging system transceivers, near field communications (NFC) circuitry, etc.

Wireless communications circuitry 34 may include satellite navigation system circuitry such as global positioning system (GPS) receiver circuitry 42 for receiving (GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. If desired, one or more of antennas 40 may be cavity-backed antennas. Different types of antennas may be used for different bands and combinations of bands. For example, one type of antenna may be used in forming a local wireless link antenna and another type of antenna may be used in forming a remote wireless link antenna.

Transmission line paths may be used to couple antenna structures 40 to transceiver circuitry 90. Transmission lines in device 10 may include coaxial cable paths, microstrip transmission lines, stripline transmission lines, edge-coupled microstrip transmission lines, edge-coupled stripline transmission lines, transmission lines formed from combinations of transmission lines of these types, etc. Filter circuitry, switching circuitry, impedance matching circuitry, and other circuitry may be interposed within the transmission lines, if desired.

Device 10 may contain multiple antennas 40. One or more of the antennas may be blocked or otherwise affected by a user's body or other external object while one or more other antennas are not affected by the external object. If desired, control circuitry 30 may be used to select an optimum antenna to use in device 10 in real time (e.g., an optimum antenna to transmit signals, etc.). Control circuitry 30 may, for example, make an antenna selection based on information on received signal strength, based on sensor data (e.g., information from a proximity sensor indicating which of multiple antennas may be affected by an external object), based on tapped antenna signals from a coupler (e.g., antenna impedance information), based on connector usage information, based on information received from external equipment such as a cellular telephone network base station, or based on other information.

As shown in FIG. 2, electronic device 10 may communicate wirelessly with external equipment 80 over wireless links such as wireless link 82. External equipment 80 may include cellular telephone network base stations, wireless local area network equipment (e.g., wireless routers and/or wireless access points), peer devices, and other external equipment. Link 82 may be a cellular telephone link, a wireless local area network link, or a communications link supported using other types of wireless communications.

Figure 3:
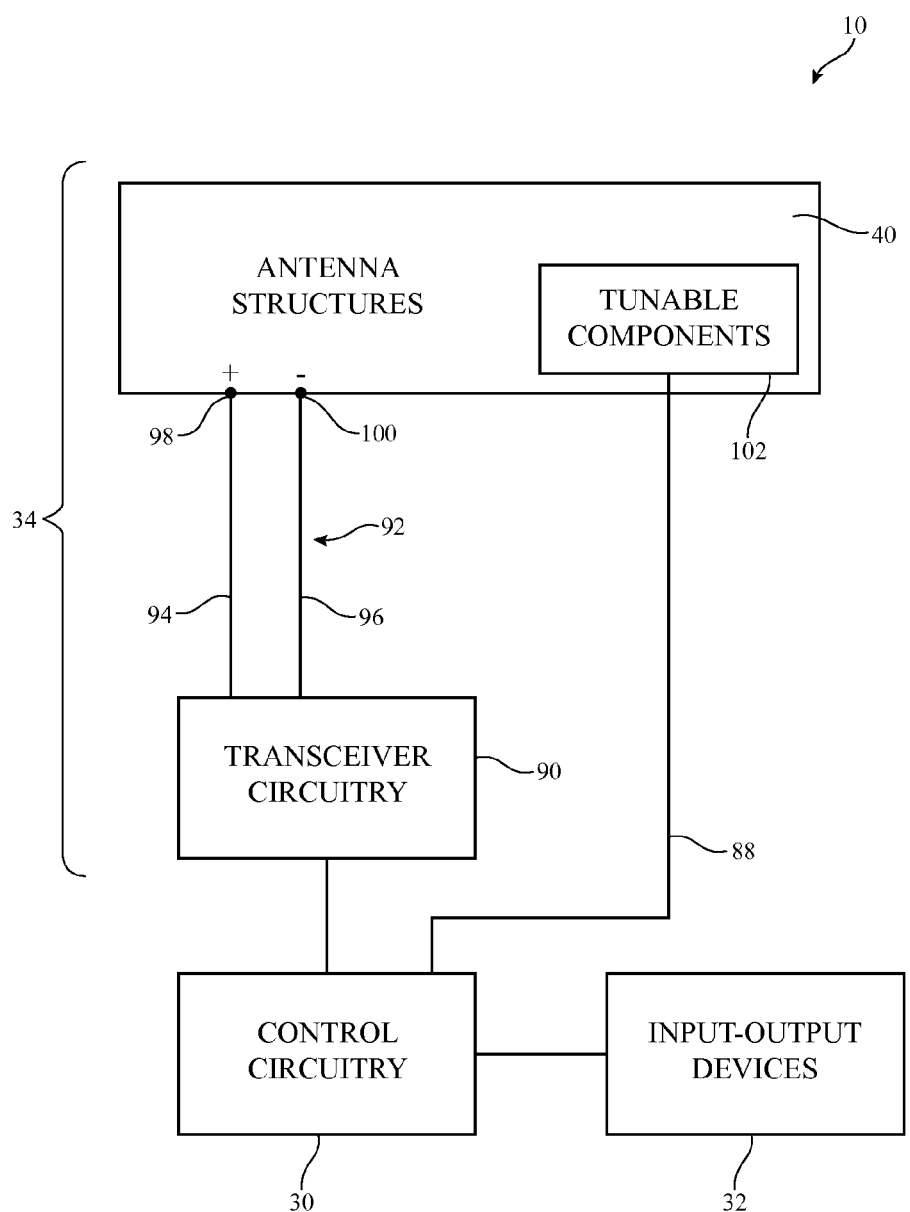
FIG. 3 is a diagram of illustrative wireless circuitry in accordance with an embodiment.

As shown in FIG. 3, transceiver circuitry 90 in wireless circuitry 34 may be coupled to antenna structures 40 using paths such as path 92. Wireless circuitry 34 may be coupled to control circuitry 30. Control circuitry 30 may be coupled to input-output devices 32. Input-output devices 32 may supply output from device 10 and may receive input from sources that are external to device 10.

To provide antenna structures 40 with the ability to cover communications frequencies of interest, antenna structures 40 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna structures 40 may be provided with adjustable circuits such as tunable components 102 to tune antennas over communications bands of interest and to ensure that a desired frequency coverage is maintained in a variety of different operating environments. Tunable components 102 may include tunable inductors, tunable capacitors, or other tunable components. Tunable components such as these may be based on switches and networks of fixed components, distributed metal structures that produce associated distributed capacitances and inductances, variable solid state devices for producing variable capacitance and inductance values, tunable filters, or other suitable tunable structures. During operation of device 10, control circuitry 30 may issue control signals on one or more paths such as path 88 that adjust inductance values, capacitance values, or other parameters associated with tunable components 102, thereby tuning antenna structures 40 to ensure that desired communications bands are covered.

Path 92 may include one or more transmission lines. As an example, signal path 92 of FIG. 3 may be a transmission line having a positive signal conductor such as line 94 and a ground signal conductor such as fine 96. Lines 94 and 96 may form parts of a coaxial cable or a microstrip transmission line (as examples). A matching network formed from components such as inductors, resistors, and capacitors may be used in matching the impedance of antenna structures 40 to the impedance of transmission line 92. Matching network components may be provided as discrete components (e.g., surface mount technology components) or may be formed from housing structures, printed circuit board structures, traces on plastic supports, etc. Components such as these may also be used in forming filter circuitry in antenna structures 40. If desired, tunable components such as tunable components 102 may be provided in an impedance matching network to help optimize the performance of the antenna(s) of device 10. Tunable matching network components may be used to make wireless circuit adjustments in combination with use of tunable components 102 in one or more antennas 40 in device 10 (e.g., tunable components that are coupled between an antenna resonating element and ground) to make wireless circuit adjustments or, if desired, matching circuit adjustments may be made separately.

Transmission line 92 may be coupled to antenna feed structures associated with antenna structures 40. As an example, antenna structures 40 may form an inverted-F antenna, a slot antenna, a hybrid inverted-F slot antenna or other antenna having an antenna feed with a positive antenna feed terminal such as terminal 98 and a ground antenna feed terminal such as ground antenna feed terminal 100. Positive transmission line conductor 94 may be coupled to positive antenna feed terminal 98 and ground transmission line conductor 96 may be coupled to ground antenna feed terminal 92. Other types of antenna feed arrangements may be used if desired. The illustrative feeding configuration of FIG. 3 is merely illustrative.

Figure 4:
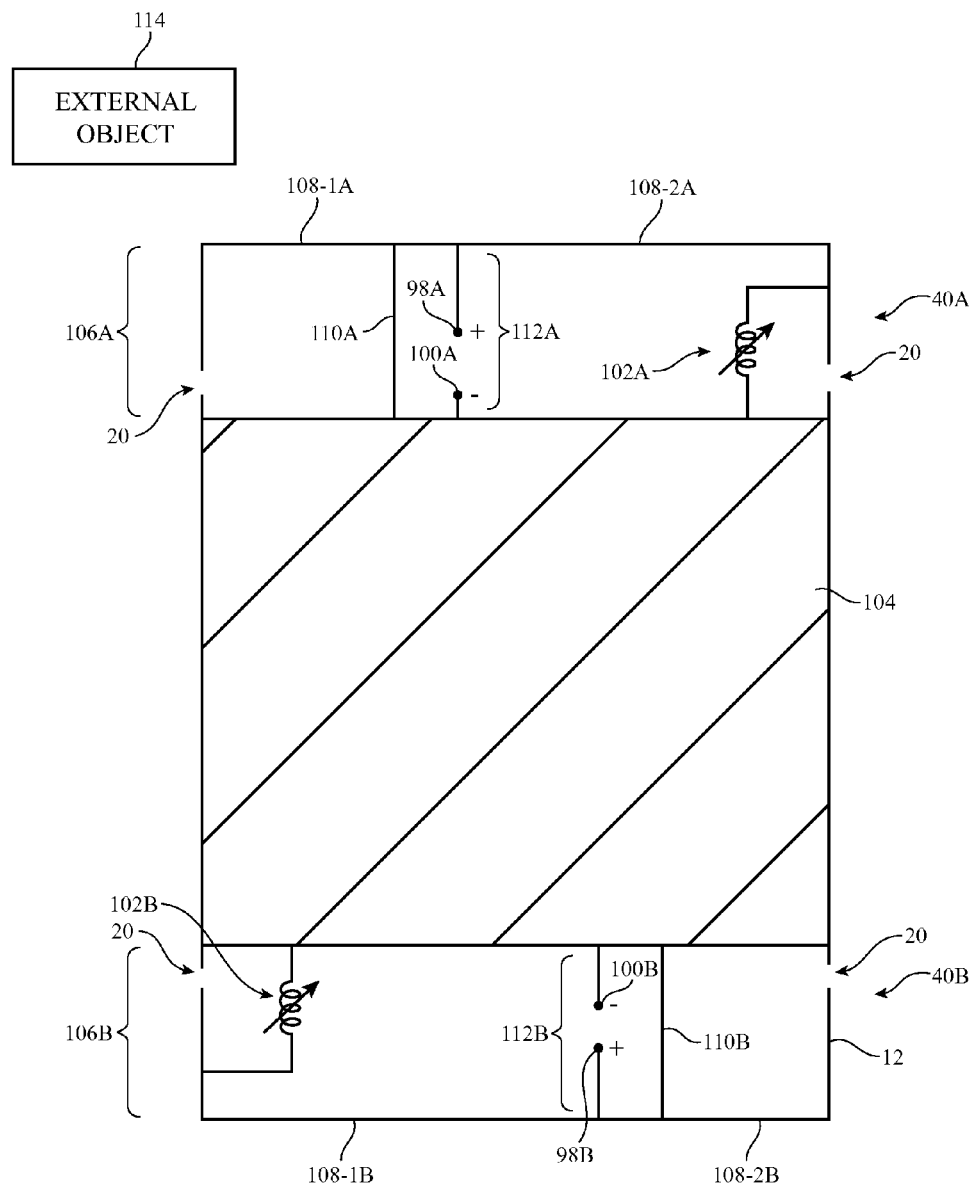
FIG. 4 is a diagram of an electronic device with a pair of antennas that may be switched into use and out of use and that may be adjusted in accordance with an embodiment.

FIG. 4 is a diagram of wireless circuitry in an illustrative configuration for electronic device 10. In the example of FIG. 4, device 10 contains two antennas 40. A first antenna (antenna 40A) is located at one end of device 10 and a second antenna (antenna 40B) is located at an opposing end of device 10. Device 10 may have additional antennas. The use of two antennas (antennas 40A and 40B) is described herein as an example. In a device of the type shown in FIG. 1, an antenna located near speaker port 18 may sometimes be referred to as an upper antenna and an antenna located near button 16 may sometimes be referred to as a lower antenna.

In the example of FIG. 4, antennas 40A and/or 40B are inverted-F antennas. This is merely illustrative. In general, antennas 40A and/or 40B may be based on any suitable antenna type (slot, inverted-F, planar inverted-F, loop, hybrid slot and inverted-F, other types of antennas, and hybrids based on multiple antenna structures such as these).

As shown in FIG. 4, inverted-F antenna 40A of FIG. 4 has antenna resonating element 106A and antenna ground (ground plane) 104. Antenna resonating element 106 may have a main resonating element arm that is split into one or more branches such as illustrative high-band branch 108-1A (for supporting a high band resonance) and illustrative low-band branch 108-2A (for supporting a low band resonance). The size of the resonating element arm of resonating element 106A (i.e., the lengths of branches 108-1A and 108-2A) may be may be selected so that antenna 40A resonates at desired operating frequencies. Return path 110A couples branches 108-1A and 108-2A to ground 104. Ground 104 may be formed from a metal housing mid-plate and/or other conductive structures in device 10. Antenna feed path 112A may be coupled in parallel with return path 110A. Feed 112A may include positive antenna feed terminal 98A and ground antenna feed terminal 100A and may run parallel to return path 110A between the branches of the inverted-F antenna resonating element arm and ground 104.

In the illustrative example of FIG. 4, inverted-F antenna 40B operates similarly to inverted-F antenna 40A. In particular, inverted-F antenna 40B has antenna resonating element 106B and antenna ground (ground plane) 104 (i.e., antenna ground 104 may be shared between antennas 40A and 40B). Antenna resonating element 106B may have a main resonating element area that is split into one or more branches such as illustrative high-band branch 108-2B (for supporting a high band resonance) and illustrative low-band branch 108-1B (for supporting a low band resonance). The size of the resonating element arm of resonating element 106B i.e., the lengths of branches 108-1B and 108-2B) may be may be selected so that antenna 40B resonates at desired operating frequencies. Return path 110B couples branches 108-1B and 108-2B to ground 104. Antenna feed path 112B may be coupled in parallel with return path 110B. Feed 112B may include positive antenna feed terminal 98B and ground antenna feed terminal 100B and may run parallel to return path 110B between the branches of the inverted-F antenna resonating element arm and ground 104.

Antenna 40A may be, for example, an upper antenna (UAT) in a rectangular device such as device 10 of FIG. 1 and antenna 40B may be an opposing lower antenna in device 10. Configurations in which device 10 is a laptop computer, tablet computer, or other wireless equipment that contains two or more antennas 40 may also be used. The example of FIG. 4 is merely illustrative.

If desired, antennas such as antennas 40A and 40B may have tunable components. For example, antenna 40A may have tunable component(s) 102A and antenna 40B may have tunable component(s) 102B. Tunable components 102A and 102B may be, for example, tunable components that bridge one or more gaps 20 in the peripheral conductive member in housing 12 that is used in forming resonating elements 106A and 106B. Tunable components may be located in an antenna return path, may be coupled to an antenna feed, may span the separation between an antenna resonating element and ground in parallel with an antenna return path and/or antenna feed, may span peripheral gaps such as gaps 20, etc. The example of FIG. 4 is merely illustrative.

Antennas such as antennas 40A and 40B of FIG. 4 may be affected by the presence of nearby objects. For example, an antenna such as antenna 40A and/or 40B may exhibit an expected frequency response when device 10 is operated in free space in the absence of nearby external objects such as external object 114, but may exhibit a different frequency response when device 10 is operated in the presence of external object 114. The magnitude of the distance between external object 114 and each antenna in device 10 may also influence antenna performance.

External objects such as object 114 may include a user's body (e.g., a user's head, a user's leg, a user's hand, or other user body part), may include a table or other inanimate object on which device 10 is resting, may include dielectric objects, may include conductive objects, and/or may include other objects that affect wireless performance (e.g., by loading antennas in device 10 and thereby affecting antenna impedance for the antennas).

When an external object such as object 114 is brought into the vicinity of an antenna (e.g., when object 114 is within 10 cm of an antenna, when object 114 is within 1 cm of an antenna when object 114 is within 1 mm of an antenna, or when the distance between an antenna of device 10 and object 114 has other suitable values), the antenna may exhibit an altered frequency response (e.g., the antenna may be detuned because the impedance of the antenna has been changed due to loading from object 114). Wireless signals can also be attenuated (i.e., blocked) by being absorbed and/or reflected by object 114. In some situations, antennas such as antennas 40A and 40B can be detuned due to the presence of metal associated with an external connector that has been plugged into device 10. When device 10 is communicating with external equipment such as equipment 80 of FIG. 2, objects in the vicinity of external equipment 80 (which may or may not be in the vicinity of device 10) may also affect wireless performance for device 10 (e.g., by blocking signals that are traveling between external equipment 80 and device 10, etc.).

Antenna-related performance issues such as signal quality issues and other performance issues can be addressed in real time by actively adjusting tunable components such as tunable components 102A and 102B, by adjusting antenna port selections, and by otherwise adjusting the operating of the wireless circuitry of device 10.

A wireless circuit control algorithm may be implemented by control circuitry 30. Antenna adjustments can be made by control circuitry 30 based on knowledge of the current operating state of device 10, based on sensor data based on connector usage information, based on received signal strength information or other signal information, based on information from external equipment 88, and/or based on antenna impedance information.

Figure 5:
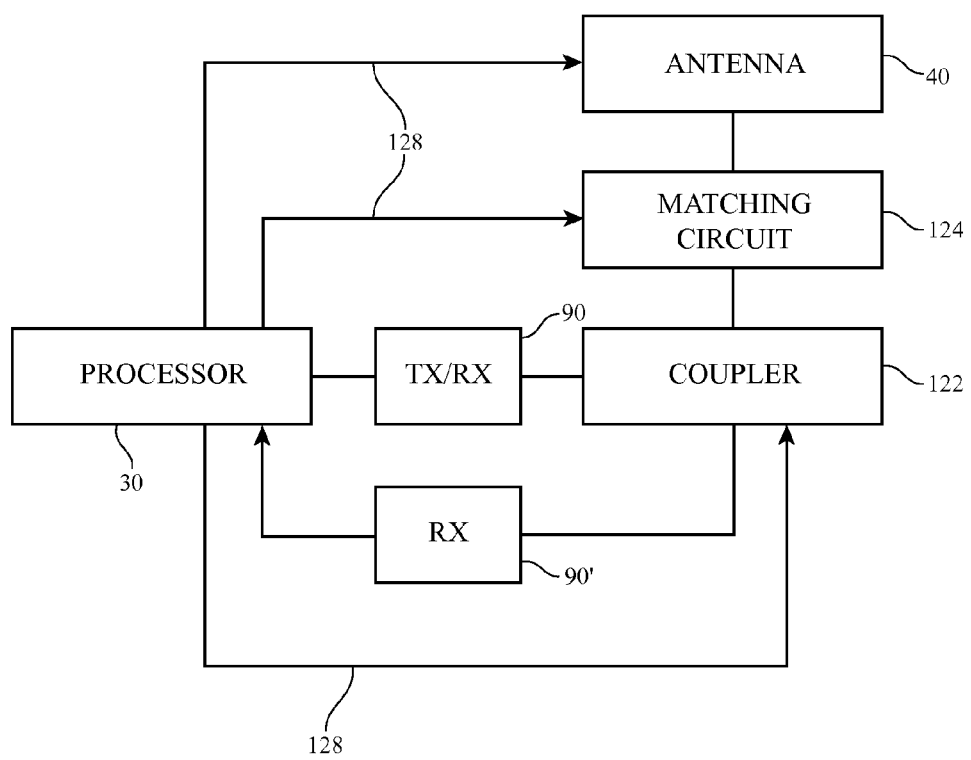
FIG. 5 is a diagram of illustrative circuitry that may be used in gathering antenna impedance information and tuning an adjustable impedance matching circuit for an antenna in accordance with an embodiment.

Illustrative circuitry for using feedback to measure antenna impedance in real time is shown in FIG. 5. The circuitry of FIG. 5 may be used to measure the impedance of antenna 40A and/or antenna 40B of FIG. 4 or other antennas in device 10. As shown in FIG. 5, antenna 40 (e.g., antenna 40A, antenna 40B, etc.) may be coupled to coupler 122 via adjustable impedance matching circuit 124. Coupler 122 may be used to tap antenna signals flowing to and from antenna 40. Tapped antenna signals from coupler 122 may be processed using a receiver in transceiver circuitry 90 or a separate receiver. As shown in FIG. 5, for example, coupler 122 may provide tapped antenna signals to receiver 90'. Processing circuitry 30 (e.g., circuitry in a baseband processor, circuitry in a microprocessor, and/or other control circuitry) may be coupled to transceiver 90 and receiver 90'. Control paths 128 may be used by processing circuitry 30 to adjust antenna 40 (e.g., to adjust tunable components 102 in antenna 40 and thereby tune antenna 40), to adjust the impedance of impedance matching circuit 124 (e.g., to maintain a desired level of antenna performance), and/or may be used to control coupler 122 (e.g., to direct coupler 122 to provide receiver 90' with a tapped version of the signals being transmitted by a transmitter in transceiver circuitry 90 or to provide receiver 90' with a corresponding tapped version of transmitted signals that have been reflected from antenna 40). By processing the transmitted and reflected signals for antenna 40, information on the phase and magnitude of the impedance of antenna 40 may be gathered in real time. The phase and magnitude of the impedance of antenna 40 may be used to determine whether the operation of antenna 40 has been affected by the operating environment of device 10 (e.g., the presence of an external object that has detuned antenna 40).

Sensors may also be used in device 10 to determine the operating environment of device 10. As an example, des ice 10 may include capacitive proximity sensors or light-based proximity sensors (as examples). The sensors may supply sensor data to control circuitry 30. For example, a proximity sensor may supply data indicating that an external object is at a particular distance from the sensor.

If desired, device 10 may have connector sensors. Device 10 may, for example, have a connector sensor such as a pressure sensitive switch or other sensor mechanism (e.g., a light-based sensor, etc.) that detects the presence and absence of a connector that has been plugged into a connector port in device 10. Connector presence (and, if desired, connector type) may also be determined using a connector sensor that has been implemented using communications port circuitry in the control circuitry of device 10.

Sound signals can be gathered using an audio sensor, an accelerometer may gather information on device movement and on the orientation of device 10 relative to the earth, a compass or gyroscope may monitor des ice orientation and movement, light-based sensors such as cameras and ambient light sensors may gather information on the environment in which device 10 is operating, temperature sensors may gather information on device temperature, and other sensors may be used to monitor the operation of device 10.

During operation of device 10, control circuitry 30 can use information on the current operating state of device 10 to determine how to adjust tunable antenna components (e.g., components such as components 102A and/or 102B of FIG. 4) and other wireless circuitry 34. Consider, as an example, a scenario in which a user of device 10 is holding device 10 in the vicinity of antenna 40B (e.g., using a grip that covers one of gaps 20 and thereby detunes antenna 40B). In this scenario, it may be desirable to tune antenna 40B (i.e., to place antenna 40B in a state that ensures satisfactory operation of antenna 40B even in the presence of the user's hand). It may also be desirable to switch to a different antenna (i.e., to switch antenna 40A into use in place of antenna 40B). In additional to making antenna tuning adjustments and antenna port adjustments, it may be desirable to tune matching circuit 124 to adjust the transmit power of transceiver 90, to adjust the frequency of operation of wireless circuitry 34 (e.g., to switch to a different frequency and/or band), to switch between use of a first radio technology and a second radio technology, or to otherwise adjust the wireless operation of device 10 based on detected changes in the operating environment of device 10.

Figure 6:
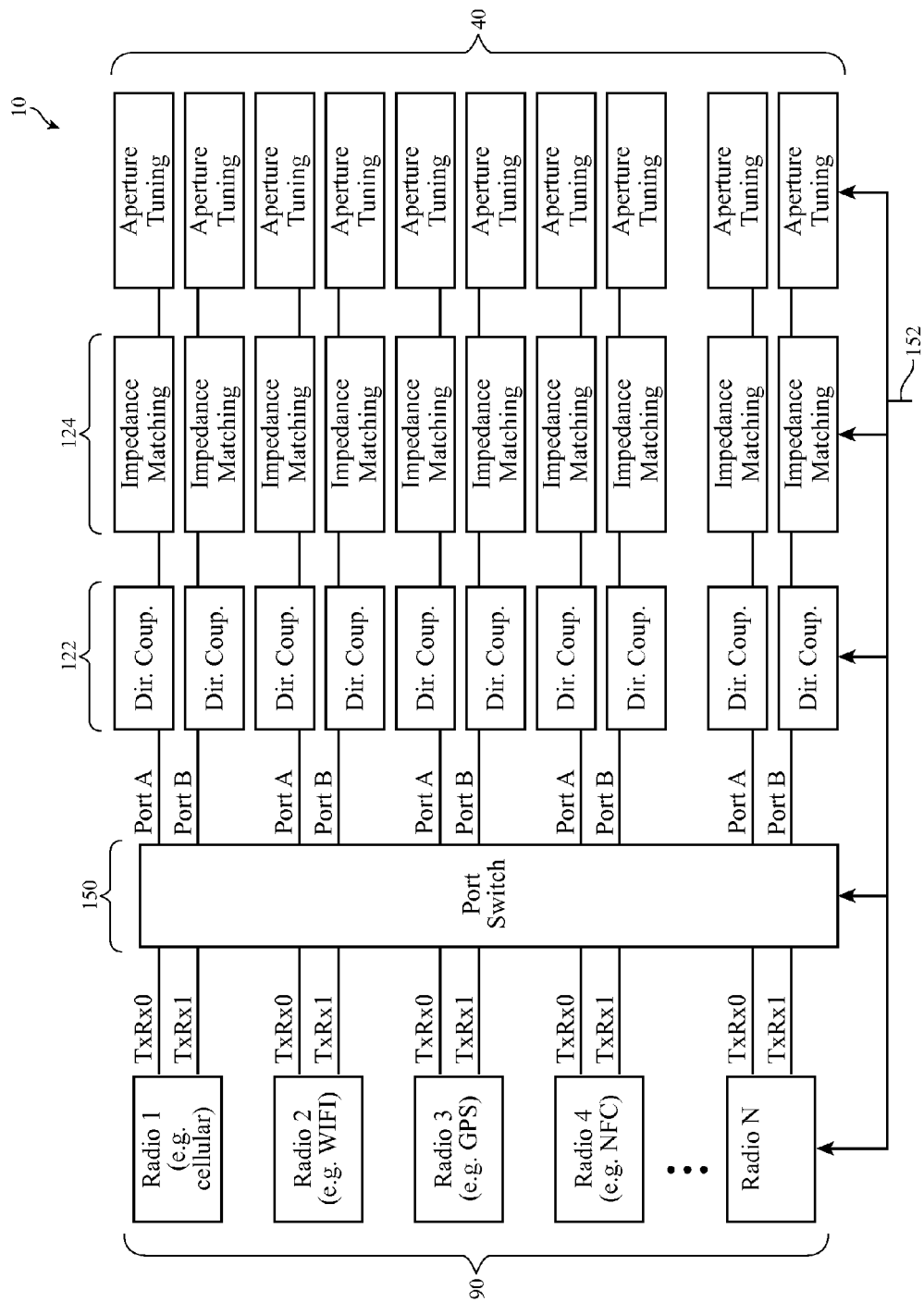
FIG. 6 is a diagram of illustrative adjustable wireless circuitry for use in an electronic device to accommodate different operating environments in accordance with an embodiment.

A generalized diagram of illustrative wireless circuitry in device 10 is shown in FIG. 6. As shown in FIG. 6, device 10 may have multiple antennas 40. Antennas 40 may have tunable components 102 and are therefore sometimes said to have aperture tuning capabilities. Antennas 40 can have associated impedance matching circuits such as impedance matching, circuits 124. Directional couplers 122 may be interposed between impedance matching circuits 124 and switching circuitry 150. Switching circuitry 150 may be used to couple one or more individual radio-frequency transceiver circuits in transceiver circuitry 90 to respective antennas 40. Switching circuitry 150 may therefore sometimes be referred to as antenna selection circuitry or antenna port selection circuitry.

During operation, control circuitry 30 may gather antenna impedance information from couplers 122, as described in connection with FIG. 5. Control circuitry 30 may also gather information from external equipment 80 that external equipment 80 is transmitting to device 10 over wireless link 82, may gather sensor information, may gather received signal strength information, signal-to-noise-ratio information, and other signal quality information from transceiver circuitry 90 (or from external equipment 80), may gather information on the currently running software on device 10 (e.g., which application program and/or other code is active), and may gather other information on device 10 and the operating environment of device 10. Based on this information, control circuitry 30 can issue control commands on paths such as paths 152. For example, control circuitry 30 can issue commands to transceiver circuitry 90 to activate desired transceiver circuits, to tune to desired operating frequencies, to adjust transmit powers, etc., can issue commands to switching circuitry 150 to switch one or more antennas into use for transmitting and/or receive signals using appropriate transceivers (radios) within transceiver circuitry 90, and can issue commands to impedance matching circuits 124 and/or tunable components 102 in antennas 40 to enhance antenna performance or make other adjustments, etc.

Any suitable number or transceivers 90 may be used in device 10. The number of transmitters and receivers in each radio (transceiver circuit) may be two or more (as an example). Port switch 150 can be located where shown in FIG. 6 or elsewhere in wireless circuitry 34. Coupler 122 can be located between port switch 150 and impedance matching circuitry 124 or may be located elsewhere in wireless circuitry 34. Adjustable components for tuning antenna(s) 40 can be coupled to antenna resonating elements in antennas 40, can be interposed in return paths associated with antennas 40, may be coupled to extended portions of resonating elements, etc.

Device 10 can systematically optimize wireless performance in real time by making port selections using port switch 150, by performing antenna aperture tuning operations using tunable components 102 in antenna(s) 40, by tuning impedance matching circuitry 124, and by making other circuit adjustments. Optimization may be performed in real time based on previously characterized device performance metrics. In performing device characterization, combined antenna system settings are preferably identified that allow device 10 to satisfy desired performance criteria such as radiated performance criteria, specific absorption rate (SAR) criteria, etc. Optimization may be achieved for one or more radios (transceivers 90). In some situations (e.g., when the body of a user of device 10 is in the vicinity of device 10), the antenna circuitry of device 10 may be adjusted to ensure that transmitted radiation is moved away from the body of the user, thereby helping to reduce specific absorption, rate (SAR) levels (absorption of radio-frequency power). Adjustments such as these may improve radiative performance and reduce radio-frequency (RF) and direct-current (DC) power consumption by device 10. The tuning of impedance matching circuits 124 may not significantly affect antenna radiation patterns, but can help optimize wireless performance by improving impedance matching in a variety of operating conditions.

During operation, device 10 can determine how device 10 is being used by the user of device 10 (i.e., the usage scenario for device 10 can be ascertained) and can gather information about the operating environment for device 10 (e.g., whether antenna 40 loaded by nearby objects, etc.). As an example, device 10 can determine whether a user is making a voice telephone call, can determine whether device 10 is being held in a particular orientation (portrait, landscape, etc.), can determine whether a user is using wireless data services, etc. The usage information can help device 10 determine how to adjust transmit powers, adjust matching circuitry, tune antenna(s) 40, switch one or more antennas into use via port switch 150, etc. Device 10 can also determine directly by impedance measurements from directional couplers 122 or indirectly whether one or more antennas have been detuned or otherwise affected by the presence of nearby objects in the vicinity of device 10 and can make corresponding wireless circuit adjustments.

Device usage and antenna adjustment settings can be ascertained based on information from sensors connected to an applications processor or other control circuitry 30, antenna impedance measurements from directional couplers 122, received signal information (e.g., received signal strength information, signal-to-noise information, and other information from transceiver circuitry 90), knowledge of the power available from power amplifiers in wireless circuitry 34, information on radio technologies currently in use by wireless circuitry 34, base station information from external equipment 80 (e.g., a cellular telephone base station or other wireless base station, which may provide information such as received signal quality information, transmitted signal information, link quality, etc.), and other inputs.

Usage scenarios that can be detected by device 10 include certification modes (e.g., free space, hand and head, landscape with menu button left, landscape with menu button right), real user left hand portrait mode, left hand and heat mode, right hand mode, right hand and head mode, real user gaming grip (hands gripping opposing left and right edges of a landscape device) with left-side menu button, real user gaming grip with right-side menu button, read user body side 1, side 2, etc., metal table mode(s), wood table mode(s), glass table mode(s), etc.

To determine the current usage scenario for device 10 in static and dynamic environments, device 10 may use sensor information such as information from a headphone jack sensor or other circuitry in device 10 that is indicative or whether headphones are plugged into the audio jack of device 10 and are being used to play audio content for the user, information on whether a digital data port connector such as a dock connector or other data connector is plugged into a connector port that is in the vicinity of one or more of antennas 40 and therefore is affecting antenna performance, information from sensors such as a gyroscope sensor that indicates orientation for device 10, information from an accelerometer (e.g., a sensor that provides orientation information and/or information on movement of device 10 to determine, for example, whether device 10 is being used in portrait or landscape mode), information from one or more proximity sensors (e.g., a capacitive proximity sensor, a light-based proximity sensor, etc. to determine whether or not a user or other external object is in the vicinity of an antenna), touch screen sensors such as a capacitive touch sensor associated with display 14 (e.g., a proximity sensor formed from a touch screen) indicating whether a user's cheek, ear, body, finger, or hand is adjacent to device 10 and/or antenna(s) 40 in device 10, image sensors (e.g., a front-facing camera, a rear-facing camera, etc.), speaker circuitry (e.g., audio circuitry indicative of whether a first speaker such as a speakerphone speaker is being used to play audio, whether a second speaker such as an ear speaker is being used to play audio, etc.), microphone data from a first microphone such as a voice microphone and/or a second microphone such as a video microphone, ambient light sensor information from an ambient light sensor, information from a global positioning system receiver or other satellite navigation system receiver, compass information from a compass, vibration data from an accelerometer, etc.

In addition, information on usage scenarios can be gathered based on antenna impedance. Antenna impedance data can be gathered in real time using antenna feedback from directional couplers 122, as described in connection with FIG. 5. Antenna impedance can be affected by usage scenario (e.g., when a user's hand loads an antenna, when device 10 is resting on a metal table versus a dielectric table surface, etc.). Antenna impedance for antenna(s) 40 can be measured in real time using information from coupler 122 for one or more cellular telephone antennas, one or more wireless local area network antenna(s), and one or more near field communications antennas, or other antennas. Real and imaginary (magnitude and phase) information can be gathered for antenna impedance. Antenna impedance information can also be gathered for one or more antennas 40, for two or more antennas 40, for three or more antennas 40 (e.g., a cellular telephone antenna, a wireless local area network antenna a near field communications antenna, etc.), etc.

Radios in device 10 (e.g., wireless transceiver circuits 90) may provide information for device 10 that device 10 can use in controlling the wireless circuitry of device 10 in real time. For example, usage scenarios and other device information can be gathered based on received signal power information from transceivers 90, from signal-to-noise ratio information from transceivers 90, from other signal quality information from transceivers 90, from knowledge of which channels and/or frequency bands are active, etc. As an example, a baseband integrated circuit in transceiver circuitry 90 may produce a value for a signal quality or strength metric such as a received signal strength indication (RSSI) metric. RSSI information and/or other information about received signals that is produced by a baseband integrated circuit may be indicative of antenna performance (e.g., whether certain antennas are being detuned or blocked, etc.). Transceivers 90 may also be used to produce information such as uplink and downlink channel quality indicators and rank indicators, transmit power levels, etc.

An optimization algorithm for adjusting wireless circuitry 34 may be implemented by control circuitry 30 of device 10. The optimization (control) algorithm may be based on a weighted summation of the signal to a signal-based metric such as signal-to-noise ratio across multiple links (e.g., signal-to-noise ratio values for links associated with different, respective transceivers 90). In the weighted summation, signal-to-noise ratio may be summed across both uplinks and downlinks. Weighting in the control algorithm can prioritize one transceiver over others. For example, a cellular telephone transceiver can be prioritized over a wireless local area network transceiver to reduce the possibility of an undesired cellular telephone call drop.

The signal-to-noise ratio of the uplink for a transceiver may depend on usage scenario, antenna efficiency, and potential interference (coexistence issues) between transceivers (which may involve linear and nonlinear effects). A control algorithm for adjusting wireless circuitry 34 based on signal-to-noise ratio optimization (e.g., using a weighted optimization function) can enable transceivers to reduce transmit power to minimize power consumption while maintain a transmit power level that sustains a desired communications link quality.

Weights in the control algorithm can be dynamic. Dynamic weights can be adjusted in real time as a function of the operational modes of the transceivers being employed. For example, weights can be adjusted based on factors such as which transceivers 90 are in use and are transmitting signals. Weights can also be adjusted based on transmit power values and the frequencies of operation of each transceiver. These factors affect whether or not coexistence issues (interference issues) may exist between transceivers that can be addressed by suitable wireless circuit adjustments.

In general, signal-to-noise ratio values will also be dependent on effects such as channel fading, path loss, co-channel interference, etc. Antenna efficiency patterns may be adjusted in real time to mitigate these effects (e.g., antenna tuning may be performed to effectively beam form the antenna's pattern). Appropriate signal-to-noise ratio weights in a weighted optimization function or other wireless control algorithm settings for device 10 can be identified by characterizing the performance of device 10 over some or all of the expected operating conditions for device 10.

The control algorithm may, if desired, take into account which radio technology is being used by each transceiver. Multiple simultaneously active control loops may be used, each of which helps optimize the wireless performance of a different respective transceiver. In some situations, optimization can be performed solely for transmit power (as a representative of uplink signal-to-noise ratio). As an example, one control loop may be used to identify a current usage scenario for device 10 and may tune antenna(s) 40 based on the identified usage scenario. Usage scenario indicators cart be used to determine whether or not a usage scenario has changed sufficiently to require a new update to antenna tuning settings. Hysteresis may be employed to ensure that wireless circuit settings are not toggled excessively. An additional control loop may he used by device 10 for impedance tuning by adjusting impedance matching circuits 124. The impedance tuning control loop may have a higher bandwidth than other control loops such as a usage setting control loop (e.g., to help reduce control complications that might otherwise arise from the simultaneous operation of multiple control loops of identical bandwidth). A control loop that is used to adjust transceiver power levels may similarly be provided with a different bandwidth form other control loops (it desired). Impedance tuning may be used to ensure that a desired impedance is presented to transceiver circuits 90 (e.g., a 50 ohm impedance or another impedance value). Antenna(s) 40 may be configured to exhibit similar impedances under a of variety of potential usage scenarios.

An illustrative control algorithm that may be used for adjusting antenna(s) 40 involves first determining the current usage scenario (e.g., hand scenario, etc.), second setting antenna ports and adjusting antenna tuning in a way that is believed to be optimum for the usage scenario (e.g., by coupling each antenna 40 to a transceiver at an appropriate port using port switch 150, tuning each antenna, etc.), third the impedance of matching circuits 124 to further optimize wireless performance (e.g., using settings that are potentially band-specific, channel-specific, and/or radio-technology-specific). Determination of which settings are optimum under each potential operating scenario may involve full system (and multi-radio) characterizations in static and dynamic environments including total radiated power (TRP) total isotropic sensitivity (TIS), and specific absorption rate (SAR).

It desired, tradeoffs in performance may be made between multiple transceivers 90 (e.g., to favor one technology/transceiver over another in environments in which one technology or transceiver is compromised relative to another). Impedance tuning can be used to optimize for power transfer to and from each antenna 40 or, if desired, other parameters can be optimized (e.g., matching of antenna impedance to target values). System level performance can be optimized without necessarily minimizing return loss from antennas 40. Optimization can improve isolation between antennas 40 (e.g., in scenarios in which transceiver coexistence is a potential concern). Impedance adjustments (e.g., to matching circuits 124) can be made to impedance tuning circuitry that is embedded within front end modules (circuitry interposed between couplers 122 and antennas 40) to enhance system level performance. For example, antenna impedance measurements made using feedback from directional couplers 122 can be used to optimize the load presented to the front end module circuitry to achieve enhanced performance (improving, for example, duplexer isolation when needed at higher power levels to reduce transmit desensitization).

Consider, as an example, a control algorithm that places the wireless circuitry of device 10 in one of three different modes. In a first of the three modes, an upper antenna such as antenna 40A of FIG. 4 is switched into use, in a second of the three modes, a lower antenna such as antenna 40B of FIG. 4 is switched into use and is provided with a first antenna tuning (i.e., tunable components such as tunable inductor 102B of FIG. 4 is set to a first setting), and in a third or the three modes, the lower antenna is switched into use and is provided with a second antenna tuning (i.e., tunable inductor 102B or other tunable components are set to a second setting that is different than the first setting). The second mode may be used as a default when gaps such as gaps 20 of FIG. 1 for the lower antenna are not covered by a user's hand or other external object. The third mode may be used when the user's hand or other object is present and has adversely affected operation of the lower antenna in the second mode. The first mode may be used-when it is helpful to switch to the upper antenna to avoid performance degradation associated with the lower antenna (e.g., performance degradation due to the presence of the user's hand or other external object, etc.).

Figure 7:
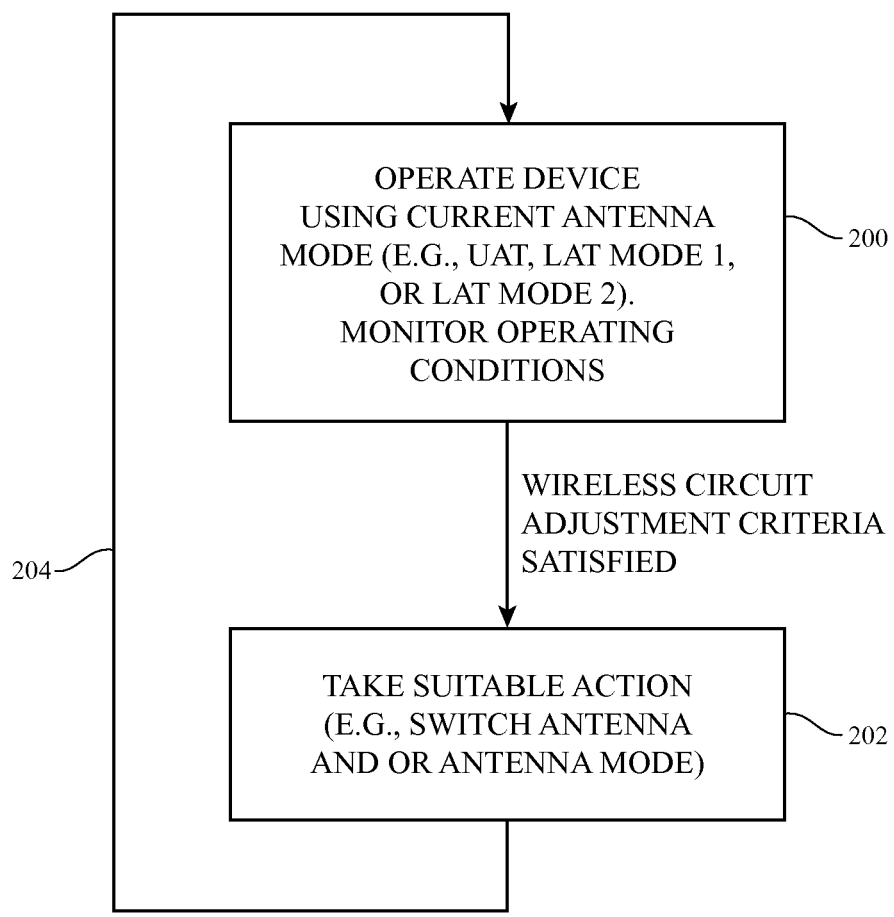
FIGS. 7 and 8 are flow charts of illustrative steps involved in operating an electronic; device with adjustable wireless circuitry in accordance with an embodiment.

Illustrative operations involved in adjusting this type of wireless circuitry for device 10 are shown in FIG. 7. At step 200, device 10 can be operated in its current antenna mode (e.g., upper antenna mode UAT, the lower antenna in the first tuning mode LAT mode 1, or the lower antenna in the second tuning mode LAT mode 2 in the present example). During the operations of step 200, device 10 can monitor sensors, user input, the state of applications running on device 10 and other device status information, can measure antenna impedance, can gather local link information (e.g., signal-to-noise ratio information from a local baseband processor, received signal strength information, etc.), and can gather link information horn a cellular base station or other external equipment (e.g., signal-to-noise ratio information or other information that is transmitted wirelessly to device 10 from external equipment 80).

Based on the information that is gathered during the operations of step 200, device 10 can determine whether wireless performance criteria are being satisfied or whether antenna mode adjustments should be made. In response to determining that antenna mode adjustments should be made, device 10 can take suitable action. For example, the current operating mode for device 10 can be switched from UAT, LAT mode 1, or LAT mode 2 to a different mode selected from this set of antenna modes (e.g., from UAT to LAT mode 1 or LAT mode 2, from LAT mode 1 to LAT mode 2 or UAT, or from LAT mode 2 to UAT or LAT mode 1). The determination of which mode to switch to may be made in advance (i.e., a predetermined pattern may be used), may be based on samples of alternative antennas modes that are made just prior to switching, or may be made using other suitable antenna switching schemes. As indicated by line 204, processing may then loop back to step 200, where device 10 truly operate using the newly selected operating mode for device 10. If desired, device 10 may operate in more modes (e.g., multiple UAT modes, etc.). The use of a port switching scenario for device 10 in which the antennas can be operated in an upper antenna mode or one of two different lower antenna modes is merely illustrative.

Figure 8:
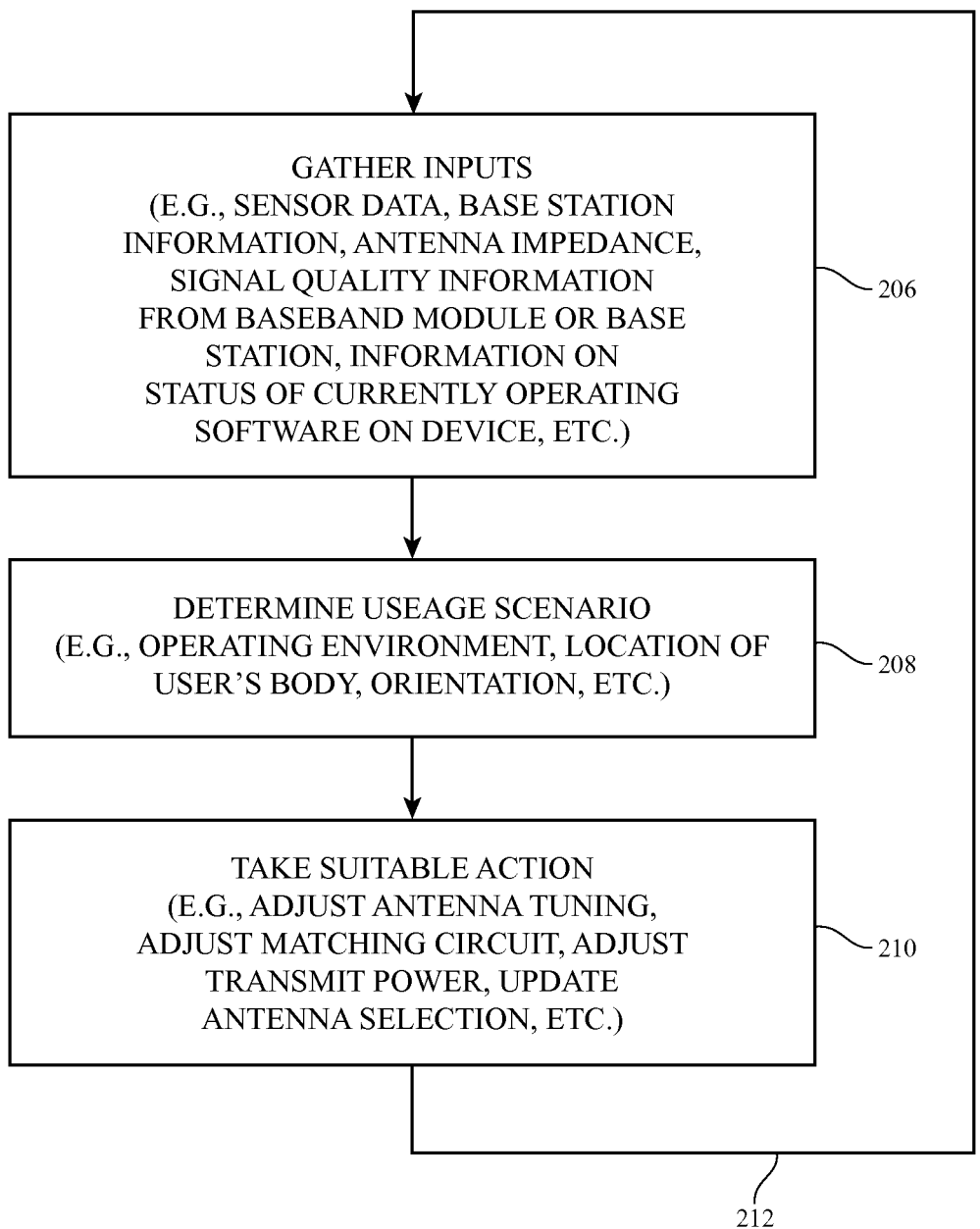

FIG. 8 is a generalized flow chart of illustrative steps involved in operating, device 10 while making real time wireless circuit adjustments to optimize wireless performance.

At step 206, device 10 can gather one or more inputs. Examples of input that may be gathered by device 10 include sensor data, information from a remote base station, antenna impedance, signal quality information from a baseband integrated circuit or other control circuit in device 10 and or from external equipment such as a base station, information on the status software running on device 10 and the operation of device 10 (e.g., whether a voice call is being made by the user of device 10, whether audio ports and/or other connector ports are being used by device 10, etc.).

Based on the information collected at step 206, device 10 can determine the current usage scenario for device 10 (step 208). Device 10 may, for example, determine whether external objects are located in the vicinity of device 10, may determine whether antennas in device 10 are being affected by the presence of nearby objects and/or objects with particular electrical properties (conductive, dielectric, etc.), may determine how device 10 is oriented relative to the Earth so that orientation-based antenna performance variations can be taken into account, may determine how device 10 is being held by a user, etc.

Based on the usage scenario identified at step 208, device 10 can take suitable action (step 210). Device 10 may, for example, adjust antenna tuning by adjusting tunable components 102, may adjust antenna impedance matching circuits 124, may adjust antenna port selection switch 150 to switch a desired antenna into use for each of one or more respective transceivers 90, may adjust transmit powers, may adjust which radio technologies are active, and/or may adjust other transceiver and wireless circuit settings. As indicated by line 212, processing may then loop back to step 206, so that additional inputs may be gathered.

Figure 9:
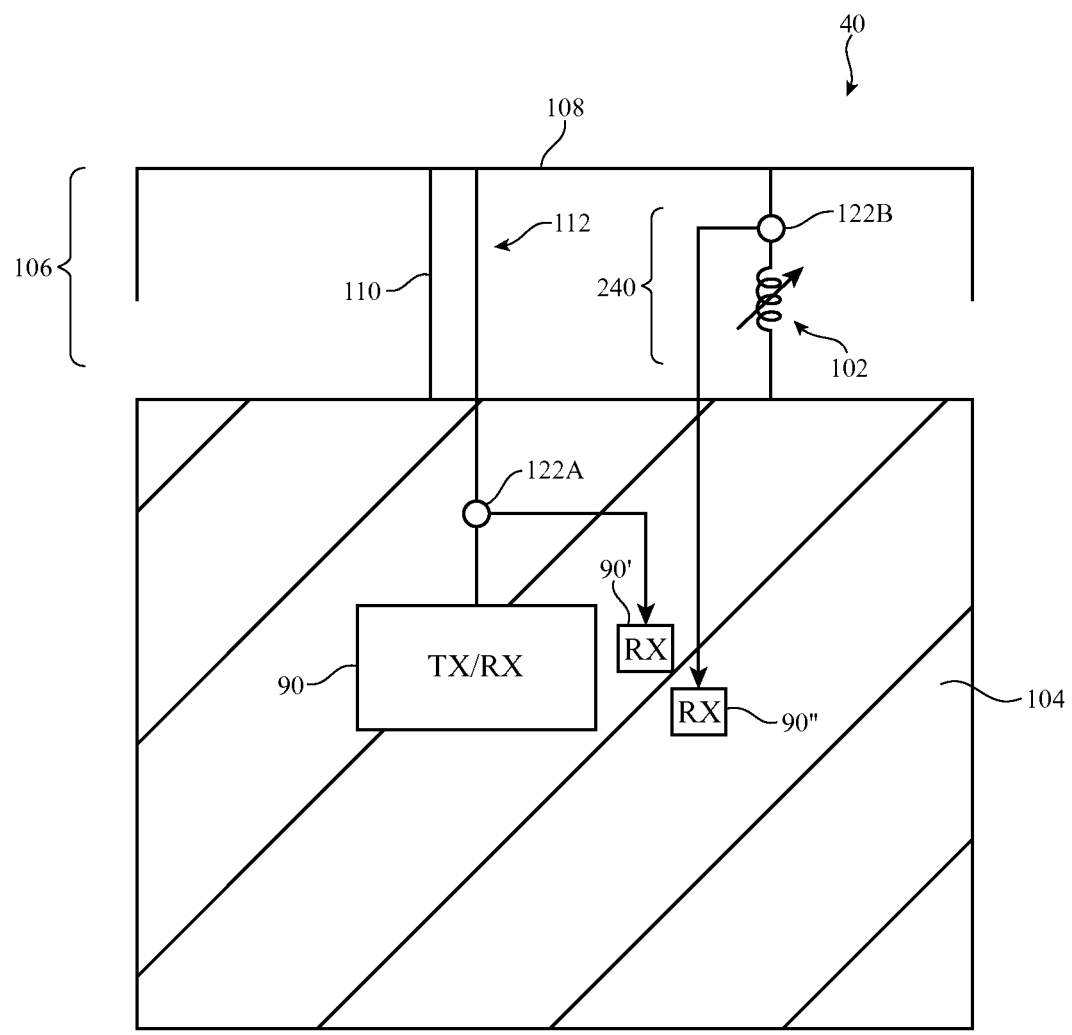
FIG. 9 is a diagram showing illustrative locations for incorporating couplers into an antenna to monitor antenna behaviour in accordance with an embodiment.

If desired, a coupler for making measurements on antenna behavior (e.g., impedance measurements showing how antenna 40 is being affected by the presence or absence of contact with external objects or other changes in environmental conditions) may be made using multiple couplers and/or using couplers that are located in portions of antenna 40 other than the antenna feed. This is illustrated in the example of FIG. 9. Antenna 40 of FIG. 9 is an inverted-F antenna having inverted-F antenna resonating element 106 and antenna ground 104. Antenna resonating element 106 has a main resonating element arm 108. Arm 108 of FIG. 9 has two branches for supporting high band and low band operation. Other configurations for resonating element 106 may be used, if desired. Return path 110 and feed 112 are coupled in parallel between antenna resonating element arm 108 and antenna ground 104.

In the illustrative example of FIG. 9, two couplers are used in gathering information about the behavior of antenna 40: coupler 122A and coupler 122B. Coupler 122A is interposed between transceiver 90 and antenna 40 on feed path 112 and can be used to measure the impedance of antenna 40, as described in connection with directional couplers 122 of FIG. 6. Coupler 122B in the example of FIG. 9 has been interposed in tuning circuit path 240. Tuning path 240 includes tunable component 102 (e.g., an adjustable inductor). Coupler 122B may be used to make impedance measurements in path 240 (e.g., to measure the impedance of component 102 in real time as the environment of device 10 changes due to the presence or absence of external objects, etc.). Receiver 90' may be used to measure signals tapped by coupler 122A and receiver 90" may be used to measure signals tapped by coupler 122B. As described in connection with FIG. 8, device 10 can use information gathered from one or more couplers such as couplers 122A and 122B in determining the current usage scenario for device 10.

When antenna 40 is touched by a user's hand or other external object, coupler 122B may measure an impedance change in path 240 and can use this information to take suitable corrective action (step 212 of FIG. 8). In some configurations, the changes in impedance that result from the presence or absence of a user's body part in contact with antenna 40 may be larger when measured using a coupler in the location of coupler 122B than when measured using a coupler in the location of coupler 122A. The use of coupler 122B may therefore provide information that might otherwise be difficult or impossible to extract using only coupler 122A. In other situations, it may be desirable to gather measurements from both of these locations and/or from couplers at one or more other locations within the structures of antenna 40. In general, any type of coupler may be used to gather measurements in antenna 40 (e.g., a power splitter, a four port coupler, one or more three port couplers, etc.) and these couplers may make impedance measurements on any portions of antenna 40 (e.g., a tuning path, a return path, part of a resonating element, a portion of antenna 40 that includes a tunable component, etc.). The configuration of FIG. 9 is merely illustrative.

The foregoing is merely illustrative and various modifications can be made by those skilled in the art without departing from the scope and spirit of the described embodiments. The foregoing embodiments may be implemented individually or in any combination.

What is claimed is:

1. An electronic device that wirelessly communicates with external equipment, comprising:
    an antenna;
    wireless radio-frequency transceiver circuitry that transmits and receives radio-frequency signals through the antenna, wherein the wireless radio-frequency transceiver circuitry comprises multiple transceivers;
    a tunable component that tunes the antenna; and
    control circuitry that tunes the tunable component to tune the antenna based on information received from the external equipment, wherein the control circuitry comprises baseband circuitry configured to generate receive signal strength performance metric values for each of the multiple transceivers, and the control circuitry is configured to generate a weighted summation of the generated receive signal strength performance metric values and is configured to adjust the wireless radio-frequency transceiver circuitry based on the weighted summation.

2. The electronic device defined in claim 1 further comprising:
    adjustable antenna impedance matching circuitry coupled between the wireless radio-frequency transceiver circuitry and the antenna, wherein the control circuitry adjusts the adjustable antenna impedance matching circuitry.

3. The electronic device defined in claim 2 wherein the control circuitry is configured to adjust the adjustable antenna impedance matching circuitry based on the information received from the external equipment.

4. The electronic device defined in claim 2 further comprising a sensor, wherein the control circuitry adjusts the adjustable antenna impedance matching circuitry based on information from the sensor.

5. The electronic device defined in claim 1 wherein the external equipment comprises a cellular telephone network base station and wherein the control circuitry tunes the antenna based on information received from the cellular telephone network base station.

6. The electronic device defined in claim 1 wherein the antenna is one of multiple antennas in the electronic device, wherein the wireless radio-frequency transceiver circuitry comprises multiple transceivers, wherein the electronic device further comprises antenna port selection circuitry coupled between the transceivers and the wireless radio-frequency transceiver circuitry, and wherein the control circuitry adjusts the antenna port selection circuitry.

7. The electronic device defined in claim 1 further comprising a sensor, wherein the control circuitry tunes the antenna based on information from the sensor.

8. The electronic device defined in claim 7 wherein the sensor is a proximity sensor.

9. The electronic device defined in claim 7 wherein the sensor is an accelerometer.

10. An electronic device that wirelessly communicates with external equipment, comprising:
    an antenna having an antenna resonating element, a feed path coupled to the antenna resonating element, and an antenna ground;
    wireless radio-frequency transceiver circuitry that transmits and receives radio-frequency signals through the antenna;
    a tunable component that is interposed on a tuning circuit path that is coupled between the antenna resonating element and the antenna ground, wherein the tunable component tunes the antenna;
    control circuitry that tunes the tunable component to tune the antenna based on information received from the external equipment; and
    a coupler that is interposed on the tuning circuit path and coupled to the wireless radio-frequency transceiver circuitry, wherein the control circuitry uses the coupler to gather antenna impedance information on the antenna.

11. The electronic device defined in claim 10 wherein the control circuitry is configured to tune the antenna based on the antenna impedance information.

12. The electronic device defined in claim 10 further comprising:
    adjustable antenna impedance matching circuitry coupled between the wireless radio-frequency transceiver circuitry and the antenna, wherein the control circuitry adjusts the adjustable antenna impedance matching circuitry based on the antenna impedance information.

13. The electronic device defined in claim 10, wherein the coupler is interposed between the tunable component and the antenna resonating element.

14. An electronic device that wirelessly communicates with external equipment, comprising:
    an antenna having an antenna resonating element, a feed path coupled to the antenna resonating element, and an antenna ground;
    wireless radio-frequency transceiver circuitry that transmits and receives radio-frequency signals through the antenna;
    control circuitry that tunes the tunable component to tune the antenna based on information received from the external equipment;
    a first coupler that is coupled to a first location on the antenna resonating element; and
    a second coupler that is coupled to a second location on the antenna resonating element that is different from the first location, wherein the control circuitry uses the first and second couplers to gather antenna impedance information on the antenna.

15. The electronic device defined in claim 14, wherein the first coupler is coupled between the first location on the antenna resonating element and the wireless radio-frequency transceiver circuitry and the second coupler is coupled between the second location on the antenna resonating element and the wireless radio-frequency transceiver circuitry.

* * * * *